US007022461B2

(12) United States Patent
Zheng et al.

(10) Patent No.: US 7,022,461 B2
(45) Date of Patent: Apr. 4, 2006

(54) THERMAL IMAGING COMPOSITION AND MEMBER AND METHODS OF IMAGING AND PRINTING

(75) Inventors: Shiying Zheng, Webster, NY (US); Grace A. Bennett, Scottsville, NY (US)

(73) Assignee: Eastman Kodak Company, Rochester, NY (US)

( * ) Notice: Subject to any disclaimer, the term of this patent is extended or adjusted under 35 U.S.C. 154(b) by 77 days.

(21) Appl. No.: 10/668,006

(22) Filed: Sep. 22, 2003

(65) Prior Publication Data

US 2005/0064324 A1 Mar. 24, 2005

(51) Int. Cl.

| | |
|---|---|
| ***G03F 7/038*** | (2006.01) |
| ***G03F 7/09*** | (2006.01) |
| ***G03F 7/004*** | (2006.01) |
| ***G03C 1/73*** | (2006.01) |

(52) U.S. Cl. .............................. 430/278.1; 430/270.1; 430/271.1; 430/275.1; 430/302; 430/348; 430/910; 430/964

(58) Field of Classification Search ............ 430/270.1, 430/271.1, 275.1, 278.1, 302, 348, 910, 964

See application file for complete search history.

(56) References Cited

U.S. PATENT DOCUMENTS

| | | | | |
|---|---|---|---|---|
| 4,427,758 | A * | 1/1984 | Quinn | 430/271.1 |
| 5,985,514 | A | 11/1999 | Zheng et al. | |
| 6,413,694 | B1 * | 7/2002 | Zheng et al. | 430/270.1 |
| 6,451,500 | B1 | 9/2002 | Leon | |
| 6,537,730 | B1 | 3/2003 | Fleminig et al. | |
| 6,599,674 | B1 * | 7/2003 | Kawamura | 430/270.1 |

FOREIGN PATENT DOCUMENTS

| | | |
|---|---|---|
| EP | 0 652 483 | 5/1998 |
| WO | 02/00442 | 1/2002 |

* cited by examiner

*Primary Examiner*—Richard L. Schilling
(74) *Attorney, Agent, or Firm*—J. Lanny Tucker

(57) ABSTRACT

An imaging member, such as a negative-working printing plate or on-press cylinder, has an imaging layer comprised of a thermally sensitive compound and a photothermal conversion material. The thermally sensitive compound comprises a heat-activatable bisulfite adduct and can be a polymer or a small molecule compound. In the imaging member, the thermally sensitive compound reacts to provide increased hydrophobicity in areas exposed to energy that provides or generates heat. The imaging layer is considered "switchable" and can be used to provide a lithographic printing image without traditional alkaline wet processing.

17 Claims, No Drawings

THERMAL IMAGING COMPOSITION AND MEMBER AND METHODS OF IMAGING AND PRINTING

FIELD OF THE INVENTION

This invention relates in general to thermal imaging compositions, and to direct-write imaging members (particularly lithographic printing plates) prepared therefrom. The invention also relates to a method of imaging such imaging members, and to a method of printing using them, with or without processing after imaging.

BACKGROUND OF THE INVENTION

The art of lithographic printing is based upon the immiscibility of oil and water, wherein an oily material or ink is preferentially retained by imaged areas and the water or fountain solution is preferentially retained by the non-imaged areas. When a suitably prepared surface is moistened with water and ink is applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure to a patterned light image, and perhaps post-exposure heating, either imaged or non-imaged areas are removed using wet processing chemistries.

"Direct-write" imaging avoids the need for patterned light imaging and chemical processing. Direct-write using an infrared radiation laser is a thermally driven process and is more desirable because the laser heats only a small region at a time. Moreover, computer control allows for high resolution images to be generated at high speed since the images can be produced directly on the imaging member surface, pixel by pixel. The chemical processing steps are eliminated.

Examples of thermally sensitive printing plates are described in U.S. Pat. No. 5,372,915 (Haley et al.). They include an imaging layer comprising a mixture of dissolvable polymers and an infrared radiation absorbing compound. While these plates can be imaged using lasers and digital information, they still require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing.

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

U.S. Pat. No. 3,650,743 (Hallman et al.) and U.S. Pat. No. 4,115,127 (Ikeda et) describe printing plates that do not require post-imaging processing. However, these imaging members are constructed of toxic materials such as arsenic that must be applied by vacuum deposition of mixed inorganic coating formulations.

Thermal or laser mass transfer is another method of preparing processless lithographic printing plates. Such methods are described for example in U.S. Pat. No. 5,460,918 (Ali et al.) wherein a hydrophobic image is transferred from a donor sheet to a microporous hydrophilic crosslinked silicated surface of the receiver sheet. U.S. Pat. No. 3,964,389 (Peterson) describes a process of laser transfer of an image from a donor material to a receiver material requiring a high temperature post-heating step.

Still another method of imaging that avoids chemical processing is the use of materials comprising microencapsulated hydrophobic materials as described for example in U.S. Pat. No. 5,569,573 (Takahashi et al.). Upon thermal imaging, the microcapsules rupture in an imagewise fashion to provide an ink-receptive image.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat. U.S. Pat. No. 4,034,183 (Uhlig) describes the use of high powered lasers to convert hydrophilic surface layers to hydrophobic surfaces. A similar process is described for converting polyamic acids into polyimides through a transparency mask in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al.) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al.) and U.S. Pat. No. 4,548,893 (Lee et al.) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). Such materials require aqueous processing after imaging. U.S. Pat. No. 5,512,418 (Ma) describes the use of polymers having cationic quaternary ammonium groups that are heat-sensitive. However, the materials described in this art require wet processing after imaging.

WO 92/09934 (Vogel et al.) describes photosensitive compositions containing a photoacid generator and a polymer with acid labile tetrahydropyranyl or activated ester groups. However, imaging of these compositions converts the imaged areas from hydrophobic to hydrophilic in nature.

EP 0 652 483A1 (Ellis et al.) describes direct-write lithographic printing plates imageable using IR lasers, and that do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area.

U.S. Pat. No. 5,985,514 (Zheng et al.) describes printing plates containing heat-sensitive thiosulfate polymers that can be rendered hydrophobic upon imagewise application of thermal energy.

The graphic arts industry is seeking an alternative means for providing processless, direct-write, negative-working lithographic imaging members that can be imaged without ablation, or the other problems noted above, to provide high sensitivity, high imaging speed, long shelf life, and long press life.

SUMMARY OF THE INVENTION

The problems noted above are overcome with a heat-sensitive composition comprising:

a) a thermally sensitive compound comprising a heat-activatable bisulfite adduct, and b) a photothermal conversion material.

In preferred embodiments, the thermally sensitive compound is represented by the following Structure I:

(I)

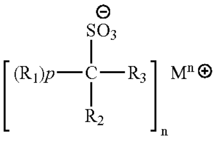

wherein $R_1$ and $R_2$ are independently aliphatic, aromatic, or polymeric groups, or $R_1$ and $R_2$ together comprise the atoms sufficient to provide a 3- to 7-membered carbocyclic or heterocyclic ring, M is a hydrogen or a cation of valency n, n is 1, 2, 3, or 4, p is 0 or 1, provided that when p is 0, $R_3$ is oxo or thioxo and when p is 1, $R_3$ is hydroxy or thio This invention also provides a thermally sensitive imaging member comprising a support having disposed thereon, the same or different layer, a) a thermally sensitive compound (such as those represented by Structure I) comprising a heat-activatable bisulfite adduct, and b) a photothermal conversion material.

In preferred embodiments, the imaging members of this invention are lithographic printing plates comprising an aluminum or polyester support having disposed thereon an imaging layer comprising:

a) one or more of the thermally sensitive compounds as represented by Structure (I);

(I)

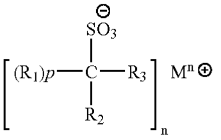

and b) a photothermal conversion material that is a carbon black or an IR dye, the one or more thermally sensitive compounds being present in an amount of from about 0.1 to about 10 $g/m^2$ and the photothermal conversion material present in an amount of from about 0.002 to about 5 $g/m^2$.

A method of imaging of this invention comprises:

A) providing the thermally sensitive imaging member of this invention, and

B) imagewise exposing the imaging member with thermal energy to provide exposed and unexposed areas in the imaging layer of the imaging member, whereby the exposed areas are rendered more hydrophobic than the unexposed areas.

In some embodiments of this invention, a method of printing comprises A) and B) noted above as well as:

C) with or without wet processing, contacting the imagewise exposed imaging member with a lithographic printing ink, and imagewise transferring the printing ink from the imaging member to a receiving material.

Still again, a method of imaging comprises:

A) spray coating the heat-sensitive composition of this invention onto a support to provide a thermally sensitive imaging member, and B) imagewise exposing the imaging member with thermal energy to provide exposed and unexposed areas in the imaging layer of the imaging member, whereby the exposed areas are rendered more hydrophobic than the unexposed areas.

The negative-working imaging members of this invention have a number of advantages and avoid the problems of previous printing plates. Specifically, the problems and concerns associated with ablation imaging (that is, imagewise removal of a surface layer) are avoided because imaging is accomplished in the imaging layer by "switching" (preferably, irreversibly) exposed relatively hydrophilic areas of the printing surface to a more hydrophobic (more ink-receptive) nature upon heating. Thus, the imaging layer stays intact during and after imaging (that is, no ablation occurs).

The thermally sensitive compounds having a heat-activatable bisulfite adduct (such as that shown in Structure I) used in the practice of this invention (including both polymers and small molecule compounds) can be readily prepared or purchased from a number of commercial sources. Thus, the imaging members are simple to make and can be used with or without post-imaging wet processing. The resulting printing members formed from the imaging members of this invention are generally negative working in nature. Moreover, the imaging members are durable because upon heating, the heat-sensitive compounds described above not only provide hydrophobicity, but they may also undergo further chemical reaction after switching in the exposed areas.

DETAILED DESCRIPTION OF THE INVENTION

"Photothermal conversion materials" are inorganic or organic compounds that absorb radiation from an appropriate energy source (such as a laser) and converts that radiation into heat. More details of such compounds are provided below.

As known in the lithographic printing art, materials that release or repel oil-based inks are referred to as having "oleophobic", "hydrophilic", or "ink-repelling" character, and conversely, materials that accept oil-based inks are referred to an "oleophilic" or "hydrophobic."

"Wet processing" refers to washing off unexposed regions of the imaging layer after imaging using water or a fountain solution. It does not refer to contacting the imaging member with alkaline developers or other chemical processing solutions used in conventional lithographic developing methods.

The imaging members of this invention comprise a support and one or more layers thereon that include a dried thermally sensitive composition as described herein. The support can be any self-supporting material including polymeric films, glass, ceramics, cellulosic materials (including papers), metals or stiff papers, or a lamination of any of these materials. The thickness of the support can be varied and should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum sheets having a thickness of from about 100 to about 600 μm. The support should resist dimensional change under conditions of use. The aluminum and polyester supports are most preferred for the imaging members of this invention.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The thermally sensitive composition of this invention can be coated or sprayed directly onto the cylindrical surface that is an integral part of the printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics. The support can also have thereon conventional reflecting layers such as layers of evaporated metals, or an IR radiation reflection layer.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This layer is prepared from a heat-sensitive composition of this invention and includes one or more thermally sensitive compounds and one or more photothermal conversion materials (both described below) as the only essential components for imaging. Because of the particular thermally sensitive compounds used in the imaging layer, the exposed (imaged) areas of the layer are rendered more hydrophobic in nature. The unexposed areas remain relatively hydrophilic in nature and can be washed off using water or a fountain solution if desired.

In an alternative embodiment, the imaging member comprises one or more thermally sensitive compounds as described herein in a surface imaging layer, and one or more photothermal conversion materials in a separate layer directly underneath, or in thermal contact with, the imaging layer. The photothermal conversion materials can diffuse into the imaging layer prior to or during imaging.

The thermally sensitive compounds useful in the imaging members of this invention can be one or more polymers or one or more small molecular compounds (non-polymeric), or the blend of both types of compounds. Useful heat-sensitive polymers can be vinyl homopolymers or copolymers prepared from one or more ethylenically unsaturated polymerizable monomers that are reacted together using known polymerization techniques. Alternatively, they can be addition homopolymers or copolymers prepared from one or more heterocyclic monomers that are reacted together using known polymerization techniques (such as polyethers or polythioethers). Additionally, they can be condensation type polymers (such as polyesters, polythioester, polyimides, polyamides, polyurethanes, polyketones, polycarbonates, polyanhydrides, polysulfones, polyarylenes, polyarylene vinylenes, polysulfines, polyureas, or phenol-formaldehyde resin) prepared using known polymerization procedures and conditions.

Whether the compounds are small molecular compounds or polymers, they comprise one or more heat-activatable bisulfite adduct groups. In the case of the polymers, the heat-activatable bisulfite adduct groups are attached (pendant) the polymer backbone.

More specifically, the thermally sensitive compounds useful in the present invention can be represented by the following Structure I:

(I)

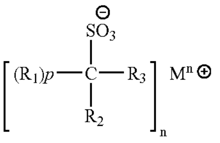

wherein $R_1$ and $R_2$ are independently aliphatic, aromatic, or polymeric groups. By "aliphatic" groups is meant saturated or unsaturated, cyclic or acyclic, hydrocarbon or hetero, non-polymeric compounds generally having a molecular weight of up to 1500. More specifically, aliphatic groups include, but are not limited to, substituted or unsubstituted alkyl, alkoxy, cycloalkyl, alkenyl, alkynyl, or heterocyclyl, groups that can also include one or more imino, sulfonamido, carbonamido, oxy, thio, ester, or ("and" or "or") ketone groups in the aliphatic chain.

By "aromatic" groups, it is meant substituted or unsubstituted carbocyclic or heterocyclic aromatic radicals having 5 to 40 atoms in the aromatic ring. Such groups include but not limited to, substituted or unsubstituted phenyl, naphthyl, anthryl, pyridyl, and perylyl groups.

One or both of $R_1$ and $R_2$ can be "polymeric" groups. Generally, only one of $R_1$ and $R_2$ is a polymeric group, meaning that the bisulfite adduct is connect to a polymeric backbone as described in more detail below.

In addition, $R_1$ and $R_2$ can be joined together with the central carbon atom in Structure I to form a substituted or unsubstituted, carbocyclic or heterocyclic non-aromatic ring having from 3 to 7 atoms in the ring. Preferably, such carbocyclic and heterocyclic rings have from 5 to 7 carbon, sulfur, oxygen, and nitrogen atoms in the rings.

In Structure I, M is hydrogen or a suitable cation having a valency up to 4. Preferably, M is a monovalent cation such as an ammonium or alkali metal ion. Preferably, M is sodium, potassium, ammonium, or quaternized ammonium.

Thus, n is an integer of 1 to 4, and preferably, n is 1.

$R_3$ is hydroxy, thio, oxo, or thioxo depending upon the value of p. If p is 0, $R_3$ is oxo or thioxo, and if p is 1, $R_3$ is hydroxy or thio.

Thus, in some embodiments where p is 1, the heat-activatable carbonyl-bisulfite adduct can be represented by the following Structure Ia:

(Ia)

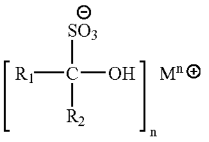

In still other embodiments, where p is 0, the heat-activatable carbonyl-bisulfite adduct can be represented by the following Structure Ib or Structure Ic:

(Ib)

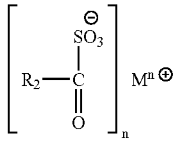

(Ic)

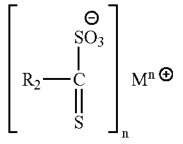

In preferred embodiments, when p is 0 and $R_3$ is oxo, $R_2$ is —$NHR_4$ wherein $R_4$ can be defined the same as $R_1$ noted above.

If the thermally sensitive compound is a thermally sensitive polymeric material, $R_1$ can be a polymeric backbone that can be represented by the following Structure II:

(II)

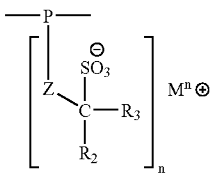

wherein P represents a polymeric backbone from any of the types of polymers described above. Preferably, P represents the backbone of a vinyl polymer.

Z is a direct bond to the bisulfite adduct group or it is a divalent linking group attached to the bisulfite adduct group. Thus, the heat-activatable bisulfite adduct can be directly attached to the $R_1$ polymeric backbone or it can be attached by means of the divalent linking group Z. Preferably, Z is a divalent linking group.

More particularly, Z can be $-(Z')_r(Z'')_t$ wherein Z' is an oxy (—O—), thio (—S—), carbonyloxy (—COO—), oxycarbonyl (—OCO—), carbonyl (—CO—), carbonyloxycarbonyl (—COOCO—), —SO—, —$SO_2$, —NHCONH—, or carbonamido (—CONH—) group. The hydrogen atoms on the carbonamido and —NHCONH— groups can be replaced with any of the groups described above for $R_1$ and $R_2$.

Z" is a substituted or unsubstituted alkylene, substituted or unsubstituted arylene or heteroarylene, substituted or unsubstituted arylenealkylene or heteroarylenealkylene, or substituted or unsubstituted alkylenearylene or alkylene-heteroarylene group, each group having up to 40 carbon atoms in the chain linking the polymer backbone to the heat-activatable group. Thus, representative Z" groups include, but are not limited to, substituted or unsubstituted methylene, ethylene, n-butylene, isopropylene, phenylene, naphthylene, anthracylene, xylylene, p-methylenephenylene, p-phenylenemethylene, phenylenemethylenephenylene, biphenylene, phenyleneisopropylenephenylene, 1,4-dimethylenephenylene, and terphenylene. Preferably, Z" is a substituted or unsubstituted alkylene or arylene group, and more preferably, it is a substituted or unsubstituted alkylene group having 1 to 6 carbon atoms (including linear and branched groups), a substituted phenylene or naphthylene group, or a substituted or unsubstituted phenylenealkylene group having 7 or 8 atoms in the linking chain.

In addition, r and t are independently 0 or 1, and preferably, each is 1.

More preferred Z groups are —COO— or —COO-Z" groups wherein Z" is a substituted or unsubstituted alkylene group having 1 or 2 carbon atoms, a substituted or unsubstituted phenylene group, or a substituted or unsubstituted naphthylene group. Most preferably, Z is —COO—.

Representative small molecule thermally sensitive compounds useful in the present invention from Structure I can be illustrated by the following types of compounds of Structures I-1 through I-4:

I-1

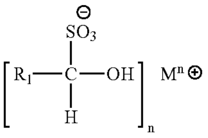

I-2

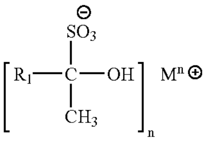

I-3

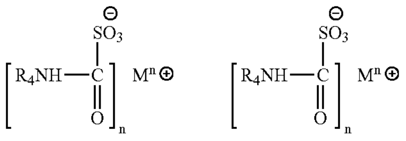

I-4

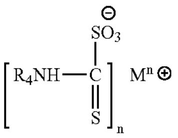

I-5

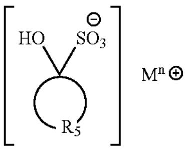

Wherein, R, and $R_4$ are as defined above, and $R_5$ is the representative atoms necessary to form a substituted or unsubstituted, carbocyclic or heterocyclic non-aromatic ring having from 5 to 7 carbon, sulfur, oxygen, and nitrogen atoms in the ring.

The following small molecule Compounds 1–6 useful in the present invention are representative compounds to illustrate reaction mechanism or as invention examples were specifically prepared in the Synthetic Examples described below:

Compound 1

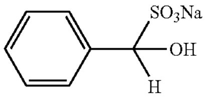

2

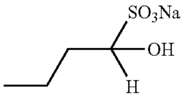

3

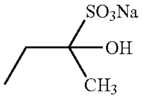

4

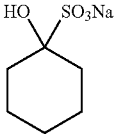

5

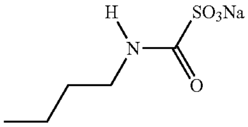

Compound 6

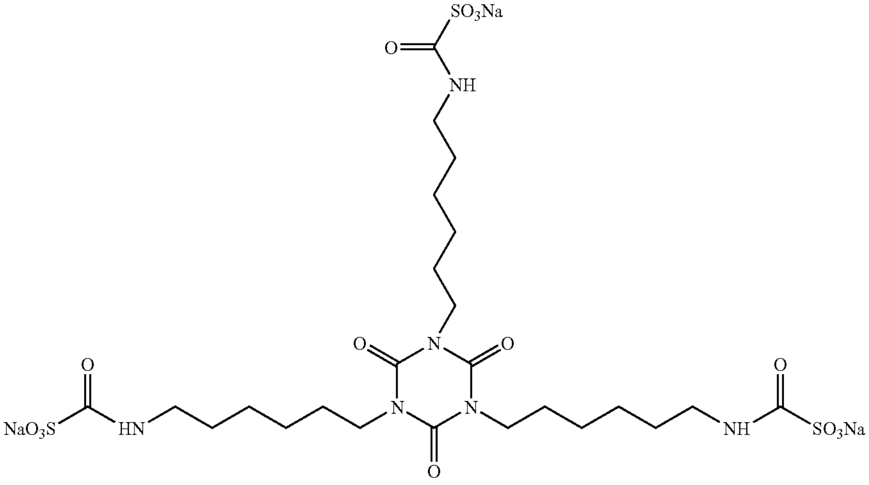

Representative polymeric thermally sensitive compounds useful in the present invention from Structure I are the following compounds II-1 and II-2:

II-1

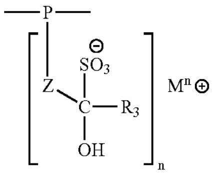

-continued

II-2

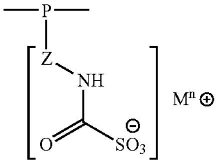

The polymeric heat-sensitive compounds useful in the practice of this invention can include recurring units that do not comprise bisulfite adduct groups. Generally, at least 10 mol %, preferably from about 15 to 100 mol %, and more preferably from about 20 to 100 mol %, of all recurring units in the polymers comprise the noted heat-activatable bisulfite adduct groups. The recurring units can be derived from polymerizable monomers that contain the heat-activatable groups, or they can be derived from monomers that, after polymerization, can be modified to provide the heat-activatable bisulfite adduct groups. Mixtures of such polymers can be used in the imaging members of this invention if desired.

Preferred heat-sensitive polymers are vinyl polymers derived from one or more ethylenically unsaturated polymerizable monomers and can be represented by the following Structure III:

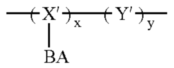

(III)

wherein X' represents recurring units to which the heat-activatable bisulfite adduct groups (represented by "BA" in Structure III) are attached, and Y' represents recurring units derived from any additional ethylenically unsaturated polymerizable monomers. The various repeating units are present in suitable amounts, as represented by x being from about 10 to 100 mol %, and y being from 0 to about 90 mol %. Preferably, x is from about 20 to 100 mol %, and y is from 0 to about 80 mol %.

Additional crosslinking can be provided in a number of ways if desired as long as this crosslinking does not interfere with the transformation of the bisulfite adduct groups during imaging. There are numerous monomers and methods for crosslinking that are familiar to one skilled in the art. Some representative crosslinking strategies include, but are not necessarily limited to:

a) reacting an amine or carboxylic acid or other Lewis basic units with diepoxide crosslinkers,
b) reacting epoxide units within the polymer with difunctional amines, carboxylic acids, or other difunctional Lewis basic unit,
c) irradiative or radical-initiated crosslinking of double bond-containing units such as acrylates, methacrylates, cinnamates, or vinyl groups,
d) reacting a multivalent metal salts with ligating groups within the polymer (the reaction of zinc salts with carboxylic acid-containing polymers is an example),
e) using crosslinkable monomers that react via the Knoevenagel condensation reaction, such as (2-acetoacetoxy)ethyl acrylate and methacrylate,
f) reacting an amine, thiol, or carboxylic acid groups with a divinyl compound (such as bis(vinylsulfonyl) methane) via a Michael addition reaction,
g) reacting a carboxylic acid units with crosslinkers having multiple aziridine units,
h) reacting a crosslinkers having multiple isocyanate units with amines, thiols, or alcohols within the polymer,
i) mechanisms involving the formation of interchain sol-gel linkages [such as the use of the 3-(trimethoxysilyl) propylmethacrylate monomer],
j) oxidative crosslinking using an added radical initiator (such as a peroxide or hydroperoxide),
k) autooxidative crosslinking, such as employed by alkyd resins,
l) sulfur vulcanization, and
m) processes involving ionizing radiation.

Polymerizable monomers having crosslinkable groups or active crosslinkable sites (or groups that can serve as attachment points for crosslinking additives, such as epoxides) can be copolymerized with the other monomers noted above. Such polymerizable monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Other additional polymerizable monomers that can provide the recurring units represented by "Y" in the Structure III above include any useful hydrophilic or oleophilic ethylenically unsaturated polymerizable monomer that may provide desired physical or printing properties to the hydrophilic imaging layer. Such monomers include, but are not limited to, acrylates and methacrylates (such as ethyl acrylate, ethyl methacrylate, n-butyl acrylate, methyl methacrylate, t-butyl methacrylate, and n-butyl methacrylate), acrylonitrile and methacrylonitrile, styrene and styrene derivatives, acrylamides and methacrylamides, vinyl ethers, vinyl pyridines, vinyl pyrrolidones, vinyl acetate, vinyl halides (such as vinyl chloride, vinylidene chloride, and vinyl bromide), and dienes (such as ethylene, ptopylene, 1,3-butadiene, and isobutylene). Acrylates, acrylamides and styrene (and its derivatives) are preferred.

The following specific polymeric thermally sensitive Compounds 7–12 were prepared in the Synthetic Examples below:

Compound 7

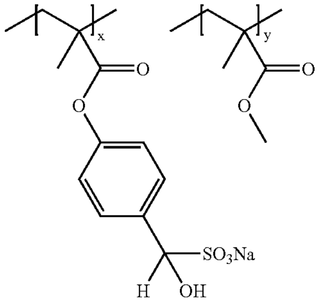

Compound 8

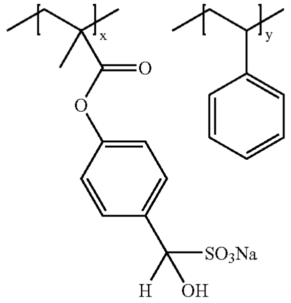

Compound 9

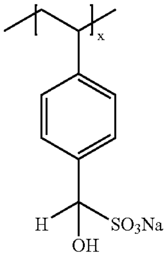

-continued

Compound 10

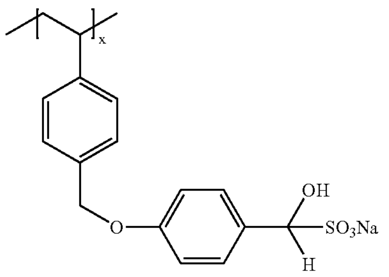

Compound 11

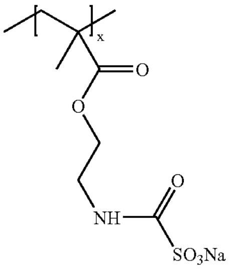

Compound 12

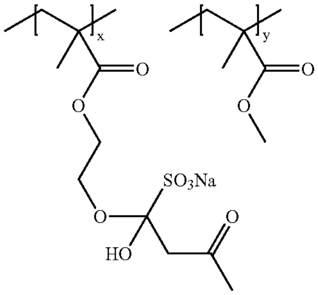

A mixture of thermally sensitive compounds can also be used in the imaging layer. Such mixtures can include one or more non-polymeric, small molecule thermally sensitive compounds, one or more thermally sensitive polymers, or one or more small molecule compounds with one or more polymeric compounds.

The thermally sensitive compounds described herein having the bisulfite adduct groups are believed to thermally de-desulfonate and switch from relatively hydrophilic to relatively hydrophobic upon exposure to thermal energy that provides or generates heat. Hence, the imaging members of this invention are negative working imaging members.

Thermally sensitive compounds comprising bisulfite adduct groups can be prepared generally by reaction with sodium bisulfite or sodium metabisulfite under mild conditions as described in "Advanced Organic Chemistry: Reactions, Mechanisms, and Structure" page 895(Jerry March, 4th edition, 1992) and *J. Org. Chem.* 1999, 64, 5722 (Kjell, et al). Polymers containing the heat-activatable bisulfite adduct groups can be prepared either from functional monomers or from preformed polymers as described above.

Representative synthetic methods for thermally sensitive compounds are illustrated below just before the Examples.

The imaging layer of the imaging member can also include minor amounts (less than 20 weight %, based on total dry weight of the layer) of additional binder or polymeric materials that will not adversely affect its imaging or printing characteristics. However, the imaging layer comprises no additional materials that are needed for imaging, especially those materials (such as novolak or resole resins) commonly used for wet processing with alkaline developer solutions.

In the heat-sensitive composition (including solvent) used to provide the heat-sensitive layer, the amount of thermally sensitive compound is generally present in an amount of at least 1% solids, and preferably at least 2% solids. A practical upper limit in the composition is 90% solids.

The amount of thermally sensitive compound(s) present in the dried imaging layer is generally at least 0.1 g/m$^2$, and preferably from about 0.1 to about 10 g/m$^2$ (dry weight). The dried imaging layer generally has an average dry thickness of from about 0.1 to about 10 μm. Greater amounts can be used if desired.

The imaging and any other layers in the imaging member can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the imaging member include one or more photothermal conversion materials. Preferably, they absorb radiation in the infrared and near-infrared regions of the electromagnetic spectrum. The photothermal conversion materials useful in this invention include infrared radiation (IR) dyes, carbon black, polymer encapsulated carbon, polymer grafted carbon, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Particular dyes of interest are "broad band" dyes, that is those that absorb over a wide band of the spectrum. Mixtures of one or more types of these compounds can be used if desired. Carbon blacks and IR dyes are preferred photothermal conversion materials.

Still other useful photothermal conversion materials include multisulfonated IR dyes as described U.S. Pat. No. 6,159,657 (Fleming et al.), oxonol IR dyes as described in U.S. Pat. No. 6,423,469 (DoMinh et al.) and U.S. Pat. No. 6,248,886 (Williams et al.), U.S. Pat. No. 6,248,893 (Williams et al.), and cationic IR dyes as described in U.S. Pat. No. 6,410,202 (Fleming et al.), the disclosures of which are incorporated herein by reference.

Useful IR dyes are sensitive to radiation in the near-infrared and infrared regions of the electromagnetic spectrum. Thus, they are generally sensitive to radiation at or above 700 nm (preferably from about 800 to about 900 nm, and more preferably from about 800 to about 850 nm). It is to be noted, however, that not every IR dye useful in thermal dye transfer materials is necessarily useful in the imaging members of the present invention. In view of the teaching provided herein, a skilled artisan would be able to use routine experimentation to find the IR dyes that are particularly useful in the present invention.

Examples of useful IR dyes of several classes include, but are not limited to, bis(dichlorobenzene-1,2-thiol)nickel(2:1) tetrabutyl ammonium chloride, tetrachlorophthalocyanine aluminum chloride, and the following compounds:

IR Dye 1

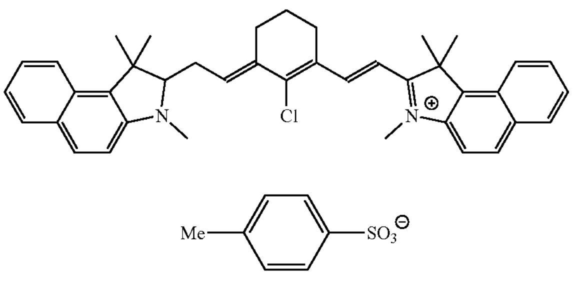

IR Dye 2 is the same as IR Dye 1 but with $C_3F_7CO_2^-$ as the anion.
IR Dye 3
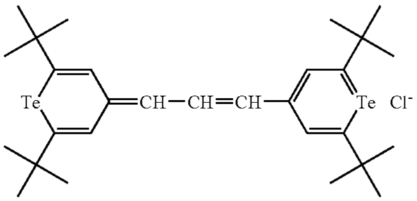
IR Dye 4
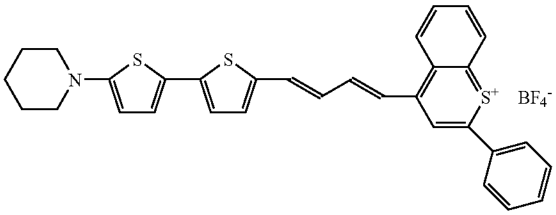
IR Dye 5
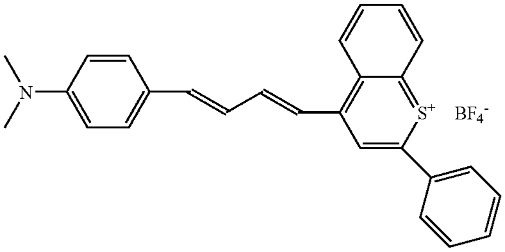
IR Dye 6
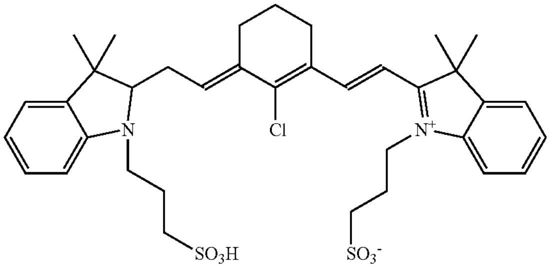
IR Dye 7
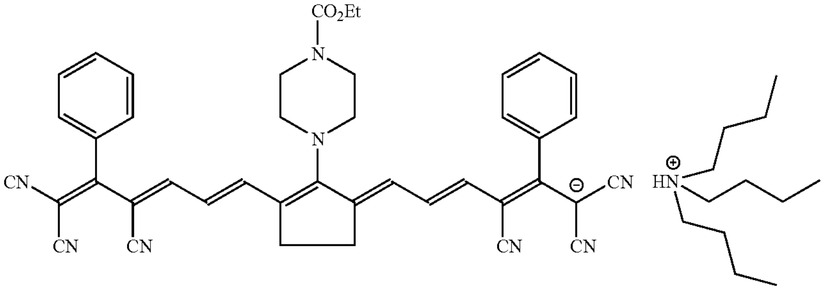
IR Dye 8
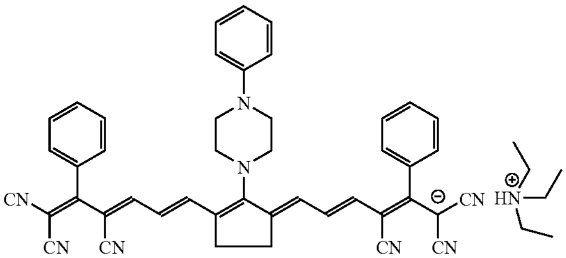
IR Dye 9
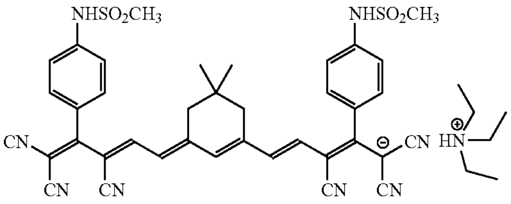
IR Dye 10
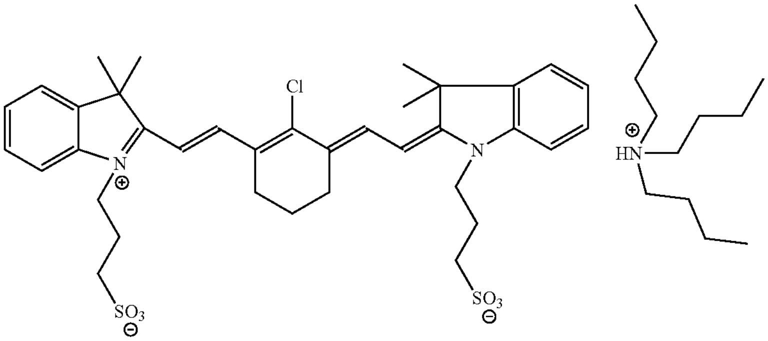

-continued
IR Dye 11
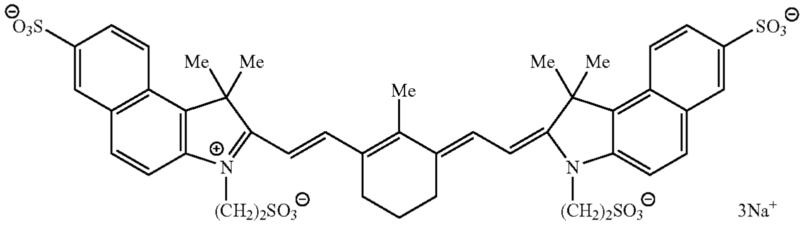
IR Dye 12
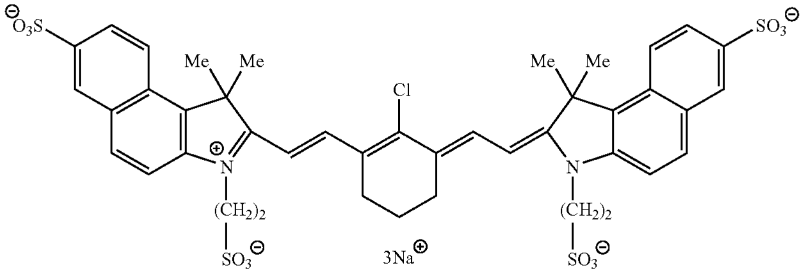
IR Dye 13
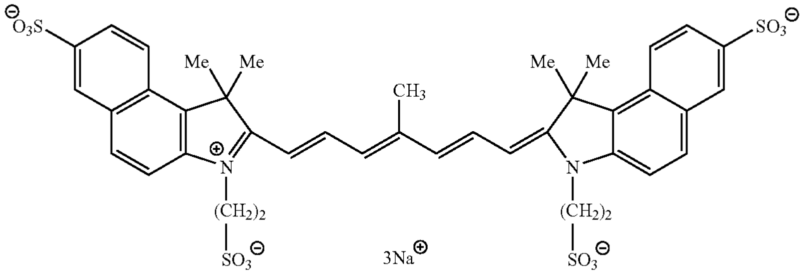
IR Dye 14
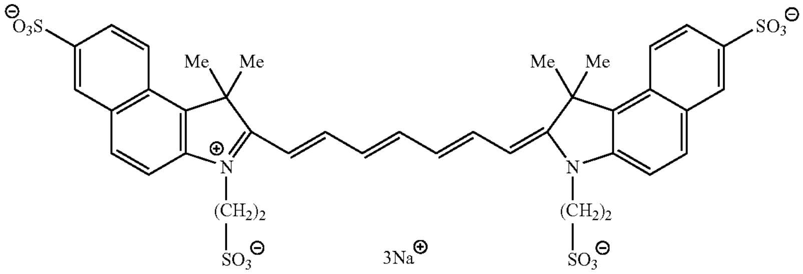
IR Dye 15
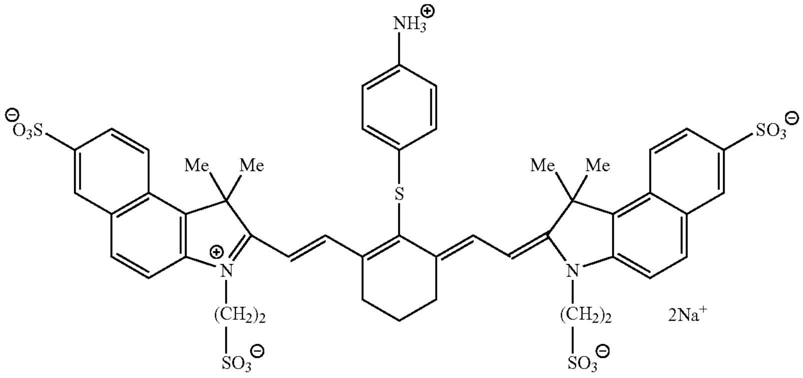

-continued

IR Dye 16

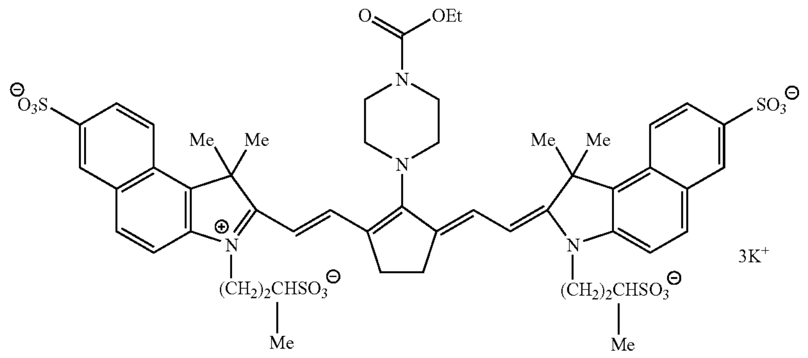

IR Dye 17

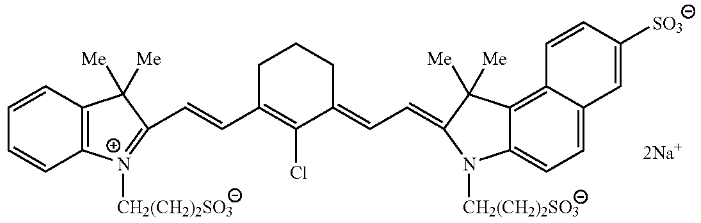

IR Dyes 1–8 can be prepared using known procedures or obtained from several commercial sources (for example, Esprit, Sarasota, Fla.). IR dyes 10–17 can be prepared using known procedures, as described for example in U.S. Pat. No. 4,871,656 (Parton et al.) and reference noted therein (for example, U.S. Pat. No. 2,895,955, U.S. Pat. No. 3,148,187 and U.S. Pat. No. 3,423,207), all incorporated herein by reference.

As noted above, the one or more photothermal conversion materials can be included in a separate layer that is in thermal contact with the heat-sensitive imaging layer. Thus, during imaging, the action of the additional photothermal conversion material can be transferred to the heat-sensitive imaging layer.

Wherever the photothermal conversion materials are located, they are generally present in an amount sufficient to provide an optical density of at least 0.1, and preferably of at least 1.0. The particular amount required for a given material and formulation can be readily determined by a skilled worker in the art using routine experimentation. In the heat-sensitive composition used to provide heat-sensitive imaging layers, the photothermal conversion material(s) is generally present in an amount of from about 5 to about 35% of the total solids (prior to drying).

The thermally sensitive composition of this invention can be applied to a support using any suitable equipment and procedure, such as spin coating, knife coating, gravure coating, dip coating or extrusion hopper coating. In addition, the composition can be sprayed onto a support, including an on-press cylindrical support (such as an on-press cylinder or sleeve), using any suitable spraying means for example as described in U.S. Pat. No. 5,713,287 (noted above) to provide an imaging member. Exposure can occur as in Step B described above.

The thermally sensitive compositions of this invention are generally formulated in and coated from water or water-miscible organic solvents including, but not limited to, water-miscible alcohols (for example, methanol, ethanol, isopropanol, 1-methoxy-2-propanol and n-propanol), methyl ethyl ketone, tetrahydrofuran, acetonitrile and acetone. Water, methanol, ethanol and 1-methoxy-2-propanol are preferred. Mixtures (such as a mixture of water and methanol) of these solvents can also be used if desired. By "water-miscible" is meant that the organic solvent is miscible in water at all proportions at room temperature.

The imaging members of this invention can be of any useful form including, but not limited to, printing plates, printing cylinders, printing sleeves and printing tapes (including flexible printing webs), all of any suitable size or dimensions. Preferably, the imaging members are lithographic printing plates having an aluminum support or on-press cylinders.

During use, the imaging member of this invention is exposed to a suitable source of energy that generates or provides heat, such as a focused laser beam or a thermoresistive head (or "thermal head"), in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al.), incorporated herein by reference. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al.). Such thermal printing heads are commercially available (for example, as Fujisu Thermal Head FTP-040 MCS001 and TDK Thermal Head F415 HH7-1089).

Imaging on printing press cylinders can be accomplished using any suitable means, for example, as taught in U.S. Pat. No. 5,713,287 (noted above) that is incorporated herein by reference.

After imaging, the imaging member can be used for printing without conventional wet processing. Unexposed areas in the imaging surface can be washed away if desired using a conventional fountain solution. Applied ink can be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following synthetic examples are presented to show how some of the preferred thermally sensitive compounds can be prepared.

Synthesis of Compound 1–4

Benzaldehyde (5.2 g, 0.049 mole) and sodium hydrogen sulfite (4.6 g, 0.044 mole) were mixed with 35 ml of ethyl acetate, 21 ml of ethanol, and 7 ml of water. The mixture was heated with stirring for 2 hours at 40° C. The white solid was filtered and air-dried and then dissolved in methanol. The insoluble part was filtered off and the filtrate was evaporated to give Compound 1 as white solid. $^1$H NMR ($D_2O$) δ(ppm): 5.41 (s, 1H), 7.32–7.43 (m, 5H).

Compounds 2–4 were similarly prepared.

Synthesis of Compounds 5 and 6 n-Butyl isocyanate (2.0 g, 0.02 mole) was dissolved in 2.0 ml of dioxane and to the solution was added 10 ml aqueous solution of sodium metabisulfite (2.3 g, 0.01 mole). The reaction turned dark orange immediately. It was stirred at room temperature overnight and then cooled down in a freezer for product to form. The orange crystals were filtered and dissolved in methanol. The insoluble part was filtered off and the filtrate was evaporated to give Compound 5 as an off-white solid. $^1$H NMR ($D_2O$) δ (ppm): 0.74 (t, 3H), 1.18–1.23 (m, 2H), 1.38–1.44 (m, 2H), 3.15 (t, 2H).

Compound 6 was similarly prepared.

Synthesis of Monomers monomer A

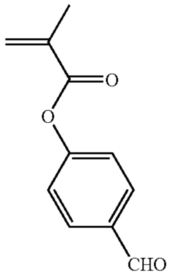

monomer B

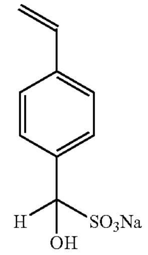

monomer C

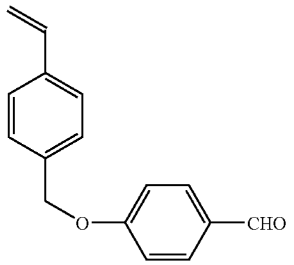

monomeer D

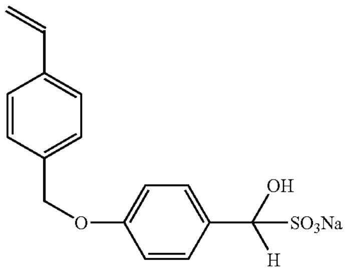

monomer E

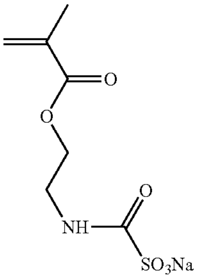

Synthesis of Monomer A:

4-Hydroxybenzaldehyde (4.9 g, 0.04 mole) was dissolved in 50 ml of methylene chloride and cooled to 0° C. To the cold solution was added triethylamine (8.1 g, 0.08 mole).

Methacryloyl chloride (8.4 g, 0.08 mole) was then added dropwise to the reaction. The reaction was stirred at room temperature overnight. The precipitate formed was filtered off and the filtrate was washed with water. The crude product was purified by column chromatography to give pure monomer A as viscous oil. $^1$H NMR ($CDCl_3$) δ (ppm): 2.03 (s, 3H), 5.80 (s, 1H), 6.39 (s, 1H), 7.32 (d, 2H), 7.95 (d, 2H), 10.02 (s, 1H).

Synthesis of Monomers B and D:

These monomers were synthesized according to the procedure used to prepare Compounds 1–4 as described above.

Synthesis of Monomer C:

4-Vinyl benzyl chloride (2.5 g, 0.016 mole) and 4-hydroxybenzaldehyde (2.0 g, 0.016 mole) were dissolved in 20 ml of methyl ethyl ketone. To the solution was added anhydrous potassium carbonate (3.4 g, 0.025 mole) and catalytic amount of 18-crown-6 and potassium iodide. The reaction was heated to reflux overnight. The reaction was cooled down and water was added. The mixture was extracted with methylene chloride and the organic phase was washed with 1 N HCl solution and dried over $MgSO_4$. The crude monomer C was recrystallized from ethanol/petroleum ether to give 2.5 g off-white crystals. $^1$H NMR ($CDCl_3$) δ (ppm): 5.14 (s, 2H), 5.28 (d, 1H), 5.77 (d, 1H), 6.68–6.78 (m, 1H), 7.07 (d, 2H), 7.37–7.46 (m, 4H), 7.83 (d, 2H), 9.89 (s, 1H).

Synthesis of Monomer E:

The monomer was synthesized according to the procedure used to prepare Compounds 5 and 6 as described above.

Synthesis of Precursor Polymers:

precursor 7A,7B

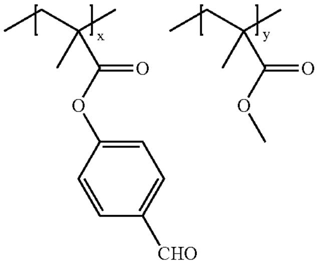

precursor 8

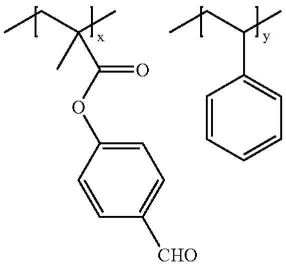

precursor 9

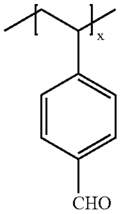

-continued precursor 10

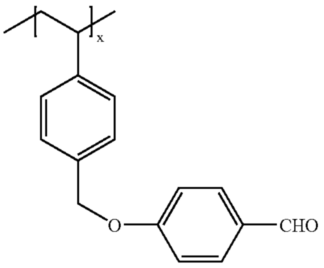

precursor 12

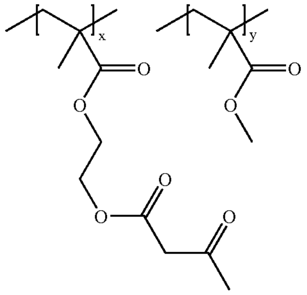

Synthesis of Precursor Compounds

Synthesis of Precursor 7A:

Monomer A (14.8 g, 0.08 mole) and azobisisobutyronitrile (AIBN, 0.13 g) were dissolved in 150 ml of THF. The solution was purged with nitrogen for 10 minutes and heated to 58° C. overnight. The resulting polymer was precipitated from methanol to give 11.2 g white powder. Size exclusion chromatography (SEC) indicated that precursor 7A has an weight molecular weight (Mw) of 28,200 and polydispersity of 2.31 relative to polystyrene standard.

Synthesis of Precursor 7B:

Monomer A (10.0 g, 0.053 mole), methyl methacrylate (MMA, 5.3 g, 0.053 mol) and AIBN (0.09 g) were dissolved in 60 ml of THF. The solution was purged with nitrogen for 10 minutes and heated to 58° C. overnight. The resulting precursor 7B was precipitated from methanol to give white powder. SEC indicated that the polymer has a Mw of 88,600 and polydispersity of 2.45 relative to polystyrene standard. $^1$H NMR analysis indicated that the molar ratio of the two monomer units in the polymer was 55/45.

Synthesis of Precursor 8:

Monomer A (10.0 g, 0.053 mole), styrene (St, 5.5 g, 0.055 mole) and AIBN (0.09 g) were dissolved in 65 ml of THF. The solution was purged with nitrogen for 10 minutes and heated to 58° C. overnight. The resulting precursor 8 was precipitated from methanol to give white powder. SEC indicated that the polymer has a Mw of 68,800 and polydispersity of 1.74 relative to polystyrene standard. $^1$H NMR analysis indicated that the molar ratio of the two monomer units in the polymer was 67/33.

Synthesis of Precursor 9:

4-Formyl styrene (12.7 g, 0.096 mole) and AIBN (0.16 g) were dissolved in 50 ml of 1,2-dichloroethane. The solution was purged with nitrogen for 10 minutes and heated to 58° C. overnight. The resulting precursor 9 was precipitated from methanol to give 8.7 g of white powder.

Synthesis of Precursor 10:

Monomer C (3.5 g, 0.015 mole) and AIBN (0.024 g) were dissolved in 20 ml of THF. The solution was purged with nitrogen for 10 minutes and heated to 58° C. overnight. The resulting precursor 10 was precipitated from methanol to 1.9 g of give white powder.

Synthesis of Precursor 12A:

2-(Methacryloyloxy)ethyl acetoacetate (15.0 g, 0.07 mole) and AIBN (0.11 g) were dissolved in 110 ml of THF. The solution was purged with nitrogen for 10 minutes and heated to 58° C. overnight. The resulting precursor 12A was precipitated from methanol to 9.8 g of give white foam after drying. SEC indicated that the polymer had a Mw of 28,900 and polydispersity of 1.81 relative to polystyrene standard.

Synthesis of Precursor 12B:

2-(Methacryloyloxy)ethyl acetoacetate (30.0 g, 0.14 mole), methyl methacrylate (14.0 g, 0.14 mol), and AIBN (0.23 g) were dissolved in 190 ml of THF. The solution was purged with nitrogen for 10 minutes and heated to 58° C. overnight. The resulting precursor 12B was precipitated from methanol to 37.1 g of give white foam after drying. SEC indicated that the polymer has a Mw of 126,000 and polydispersity of 2.99 relative to polystyrene standard. $^1H$ NMR analysis indicated that the molar ratio of two monomer units in the polymer was 66/34.

Synthesis of Compounds 7–12

Synthesis of Compound 7:

Precursor 7A (12.5 g, 0.066 mole of repeating unit) was dissolved in 80 ml of DMF. Water (8 ml) was added dropwise to the solution to prevent the polymer from precipitating out. Sodium bisulfite (10.3 g, 0.099 mole) was added to the reaction and the reaction was heated to 40° C. for 2 hours. The mixture was dialyzed against water overnight using a dialysis membrane with a 1000 MW cut-off. The solution was concentrated by bubbling nitrogen to get an aqueous solution of compound 7 with 6.4% solid.

Compounds 8, 9, 10, and 12 were prepared similarly.

Compound 9 was synthesized from monomer D as follows:

Monomer D (5.0 g) was dissolved in 10 ml of water and initiator 4,4'-azobis(4-cyanovaleric acid) (0.059 g, 75% in water) was added. The solution was heated to 60° C. overnight. The resulting solution was used for coating evaluation without further purification.

Compound 11 was prepared similarly using monomer E.

INVENTION EXAMPLES 1–7

These examples illustrate imaging members of the present invention that have imaging layers that include thermally sensitive polymers or small molecule compounds, are coated on a 0.14 mm grained anodized aluminum support, and are imaged developed on press.

A thermally sensitive imaging formulation was prepared from the following components:

| | |
|---|---|
| Thermally sensitive compounds 6–12 | 0.33 g |
| IR dye 8 | 0.03 g |
| Water | 3.2 g |
| Methanol | 0.9 g |
| Acetone | 4.5 g |

Each formulation containing 4 weight % of solids was coated to provide 100 mg/ft$^2$ of dry coverage (1.08 g/m$^2$) on 0.14 mm aluminum support. The resulting printing plates were clamped onto the rotating drum of a conventional platesetter having an array of laser diodes operating at a wavelength of 830 nm on a plate setter like the commercially available CREO TRENDSETTER™ (but smaller in size) each focused to a spot diameter of 23 μm at dosages ranging from 364 to 820 mJ/cm$^2$. Each channel provided a maximum of 450 mWatts (mW) of power incident upon the imaging layer surface. The blue imaging layer coatings showed strong bluer images in the exposed regions.

A sample of each of the laser-exposed plates was then mounted on the plate cylinder of a conventional full-page A. B. Dick 9870 lithographic duplicator press for actual press runs using Varn Universal Pink fountain solution. The fountain solution simultaneously removes non-exposed regions of the imaging layers (development). Using VanSon Diamond Black lithographic printing ink, each printing plate provided a few thousand sheets with full density images. The press results (number of acceptable sheets) are shown in the following TABLE I.

TABLE I

| Example | Thermally Sensitive Compound | Press Results (Printed Sheets) |
|---|---|---|
| 1 | 6 | 1,000 |
| 2 | 7 | 2,000 |
| 3 | 8 | 500 |
| 4 | 9 | 1,000 |
| 5 | 10 | 500 |
| 6 | 11 | 1,000 |
| 7 | 12 | 500 |

INVENTION EXAMPLES 8–14

These examples illustrate imaging members of the present invention that include IR Dye 10 as the photothermal conversion material.

Several heat-sensitive imaging formulations (Examples 8–14) were prepared and coated on 0.14 mm grained, anodized aluminum, and dried as described in Example 1, except that IR Dye 10 was used instead of IR Dye 8. Thermally sensitive compounds 6–12 were used in the respective Examples 8–14. Each resulting plate was imaged and tested on the printing press as described in Example 1 and used to acceptably print at least 500 sheets.

INVENTION EXAMPLES 15–21

These examples illustrate imaging members of the present invention that include aqueous dispersion of IR Dye 8 as the photothermal conversion material and the formulations were coated from water. IR Dye 8 was prepared as 5% dispersion in water.

Several heat-sensitive imaging formulations (Examples 15–21) were prepared and coated on 0.14 mm grained, anodized aluminum, and dried as described in Example 1 except that no organic solvent was used the formulations were prepared in water. Thermally sensitive compounds 6–12 were used in the respective Examples 15–21). Each resulting plate was imaged and tested on the printing press as described in Example 1 and used to acceptably print at least 500 sheets.

INVENTION EXAMPLES 22–28

These examples illustrate imaging members of the present invention that include aqueous dispersion of IR Dye 9 as the photothermal conversion material and the formulations were coated from water. IR Dye 9 was prepared as 5% dispersion in water.

Several heat-sensitive imaging formulations (Examples 22–28) were prepared and coated on 0.14 mm grained, anodized aluminum, and dried as described in Example 1 except that no organic solvent was used the formulations were prepared in water. Thermally sensitive compounds 6–12 were used in the respective Examples 22–28. Each resulting plate was imaged and tested on the printing press as described in Example 1 and used to acceptably print at least 500 sheets.

INVENTION EXAMPLES 29–35

These examples illustrate imaging members of the present invention that include IR Dye 13 as the photothermal conversion material and the formulations were coated from water.

Several heat-sensitive imaging formulations (Examples 29–25) were prepared and coated on 0.14 mm grained, anodized aluminum, and dried as described in Example I except that IR Dye 13 was used instead of IR Dye 8 and no organic solvent was used. The formulations were prepared in water. Thermally sensitive compounds 6–12 were used in the respective Examples 29–25. Each resulting plate was imaged and tested on the printing press as described in Example 1 and used to acceptably print at least 500 sheets.

INVENTION EXAMPLES 36–39

These examples illustrate imaging members of the invention that comprise aluminum supports and are developed by tap water or a commercial fountain solution. Imaging layers were provided as described in Examples 1 on 0.14 mm grained anodized aluminum sheets. The resulting imaging members were imaged as described above and developed with tap water or a commercial fountain solution. Printing results on the same A. B. Dick press are summarized in the following TABLE II.

TABLE II

| Example | Thermally Sensitive Compound | Developer Solution | Press Results (Printed Sheets) |
|---|---|---|---|
| 36 | 7 | Varn Universal Pink fountain solution 28 ml/3.8 liters water | 1,000 |
| 37 | 7 | Tap water | 1,000 |
| 38 | 11 | Tap water | 1,000 |
| 39 | 11 | Varn Universal Pink fountain solution 28 ml/3.8 liters water | 1,000 |

INVENTION EXAMPLES 40–46

These examples illustrate imaging members of the present invention that include carbon black as the photothermal conversion material.

Several heat-sensitive imaging formulations (Examples 40–46) were prepared and coated on 0.14 mm grained, anodized aluminum, and dried as described in Example 1, except that carbon black (Nippon Shokubai FX-GE-003) was used instead of IR Dye 8 and the formulations were prepared in water and methanol. Thermally sensitive compounds 6–12 were used in the respective Examples 40–46. Each resulting plate was imaged and tested on the printing press as described in Example 1 and used to acceptably print at least 500 sheets.

The invention has been described in detail with particular reference to preferred embodiments thereof, but it will be understood that variations and modifications can be effected within the spirit and scope of the invention.

We claim:

1. A heat-sensitive composition comprising:

a) a thermally sensitive compound comprising a heat-activatable bisulfite adduct, and b) a photothermal conversion material, wherein said thermally sensitive compound is represented by the following Structure I:

(I)

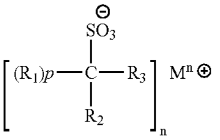

wherein $R_1$ is a polymeric group $R_2$ is an aliphatic or aromatic group, M is hydrogen or a cation of valency n, n is 1, 2, 3 or 4, p is 1, and $R_3$ is hydroxy or thio.

2. The composition of claim 1 wherein said thermally sensitive compound is a thermally sensitive polymeric material represented by the following Structure II:

(II)

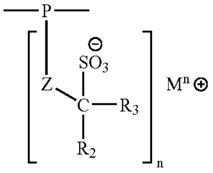

wherein Z is a direct bond or a divalent linking group and P is a polymeric backbone.

3. The composition of claim 2 wherein P is a vinyl polymer backbone.

4. The composition of claim 1 wherein said photothermal conversion material is a carbon black or an IR dye that is bis(dichlorobenzene-1,2-thiol)nickel(2:1)tetrabutyl ammonium chloride, tetrachlorophthalocyanine aluminum chloride, or one of the following compounds:

IR Dye 1

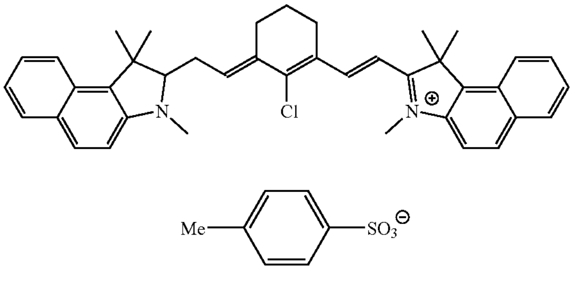

IR Dye 2 is the same as IR Dye 1 but with $C_3F_7CO_2^-$ as the anion.
IR Dye 3
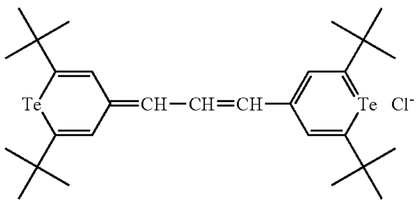
IR Dye 4
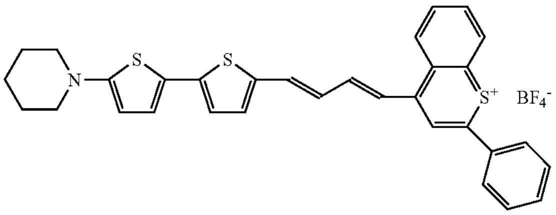
IR Dye 5
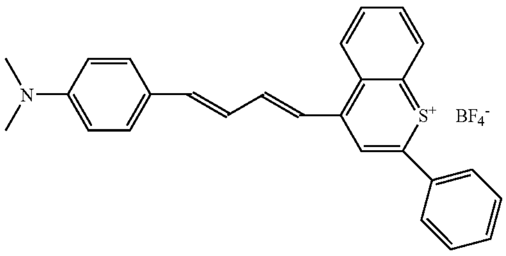
IR Dye 6
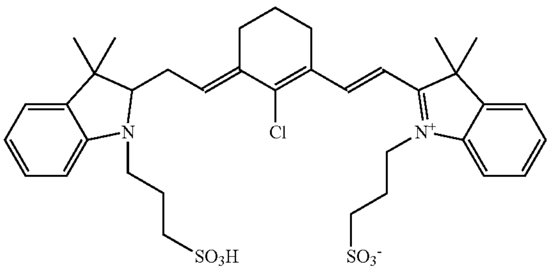
IR Dye 7
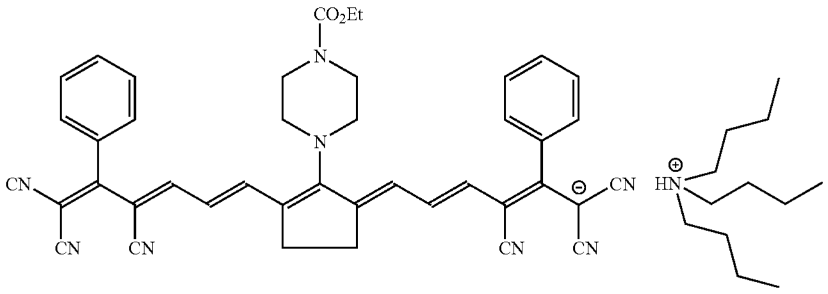
IR Dye 8
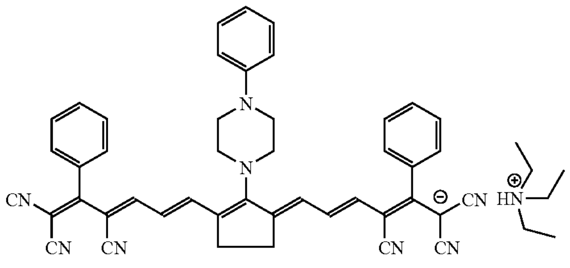
IR Dye 9
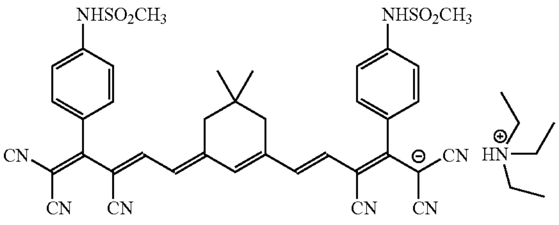
IR Dye 10
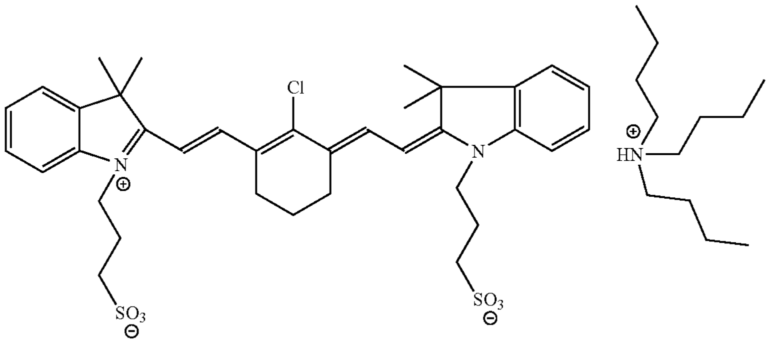

-continued
IR Dye 11
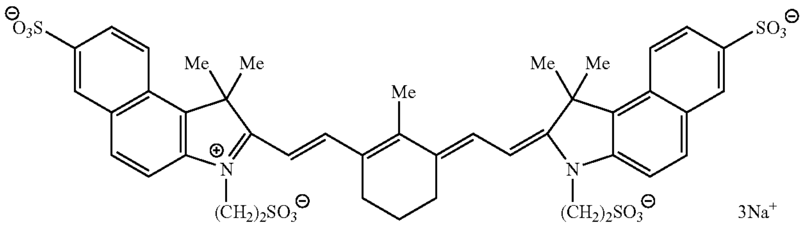
IR Dye 12
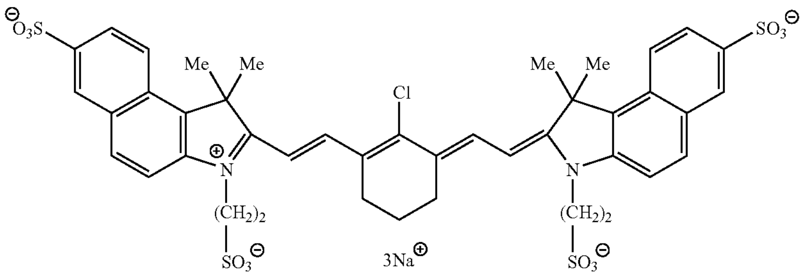
IR Dye 13
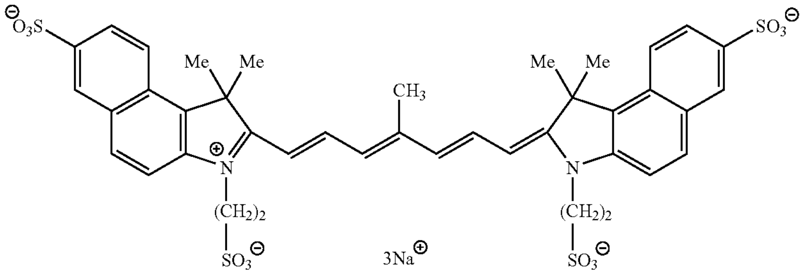
IR Dye 14
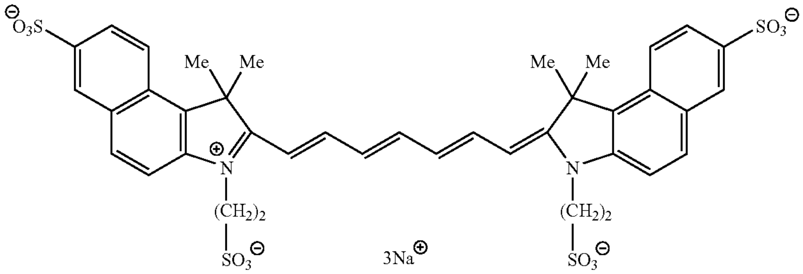
IR Dye 15
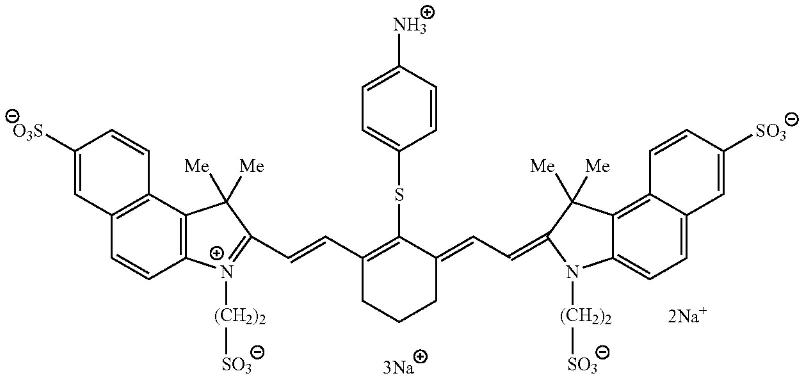

-continued

IR Dye 16

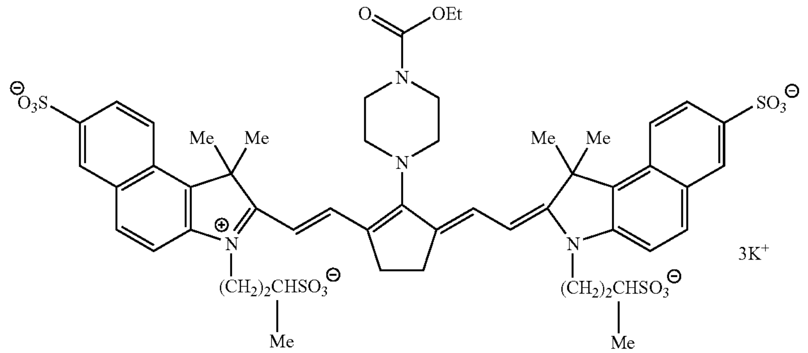

IR Dye 17

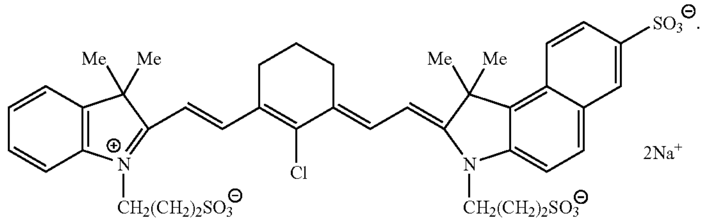

5. A thermally sensitive, negative-working imaging member comprising a support having disposed thereon, a single heat-sensitive imaging layer comprising:

a) a thermally sensitive compound comprising a heat-activatable bisulfite adduct, and b) a photothermal conversion material, wherein said thermally sensitive compound is represented by the following Structure I:

(I)

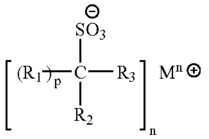

wherein $R_1$ is an aliphatic, aromatic, or polymeric backbone, $R_2$ is —$NHR_4$, M is a hydrogen or a cation of valency n, n is 1, 2, 3, or 4, p is 0 or 1, provided that when p is 0, $R_3$ is oxo or thioxo, and when p is 1, $R_3$ is hydroxy or thio, and $R_4$ is an aliphatic, aromatic, or polymeric group.

6. The imaging member of claim 5 comprising a polyester or aluminum support.

7. The imaging member of claim 5 wherein said thermally sensitive compound is present in an amount of at least 0.1 $g/m^2$, and said photothermal conversion material is present in an amount sufficient to provide a transmission optical density of at least 0.1 at 830 nm.

8. The imaging member of claim 5 wherein said support is an on-press printing cylinder.

9. The imaging member of claim 5 wherein p is 0 and $R_3$ is oxo.

10. A negative-working lithographic printing plate comprising an aluminum or polyester support having disposed thereon a single imaging layer comprising:

a) one or more of the following compounds as thermally sensitive compounds represented by Structure I:

(I)

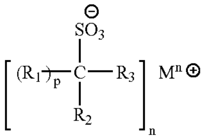

wherein $R_1$ is an aliphatic, aromatic, or polymeric backbone, $R_2$ is —$NHR_4$, M is a hydrogen or a cation of valency n, n is 1, 2, 3, or 4, p is 0 or 1, provided that when p is 0, $R_3$ is oxo or thioxo, and when p is 1, $R_3$ is hydroxy or thio, and $R_4$ is an aliphatic, aromatic, or polymeric group, b) a photothermal conversion material that is a carbon black or an IR dye, said one or more thermally sensitive compounds being present in an amount of from about 0.1 to about 10 $g/m^2$ and said photothermal conversion material present in an amount of from about 0.002 to about 5 $g/m^2$.

11. A method of imaging comprising:

A) providing the thermally sensitive imaging member of claim 5, and

B) imagewise exposing said imaging member with thermal energy to provide exposed and unexposed areas in the imaging layer of said imaging member, whereby said exposed areas are rendered more hydrophobic than said unexposed areas.

12. The method of claim 11 wherein said imagewise exposing is carried out using an IR radiation emitting laser or thermo resistive head, and said imaging member is a lithographic printing plate having an aluminum support or an on-press imaging cylinder having a cylindrical support.

13. A method of printing comprising:

A) providing the imaging member of claim 5,

B) imagewise exposing said imaging member with thermal energy to provide exposed and unexposed areas in the imaging layer of said imaging member, whereby said exposed areas are rendered more hydrophobic than said unexposed areas, and C) with or without wet processing, contacting said imagewise exposed imaging member with a lithographic printing ink, and imagewise transferring said printing ink from said imaging member to a receiving material.

14. A method of imaging comprising:

A) spray coating the heat-sensitive composition of claim 1 onto a support to provide a thermally sensitive imaging member, and B) imagewise exposing said imaging member with thermal energy to provide exposed and unexposed areas in the imaging layer of said imaging member, whereby said exposed areas are rendered more hydrophobic than said unexposed areas.

15. The method of claim 14 wherein said support is an on-press printing cylinder or sleeve.

16. The imaging member of claim 5 comprising one or more of the following compounds as thermally sensitive compounds:

Ia

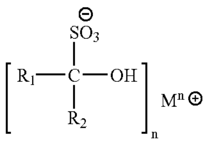

Ib

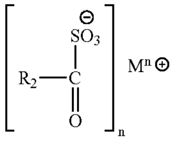

-continued

Ic

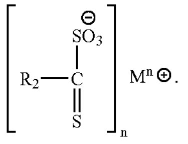

17. A thermally sensitive, negative-working imaging member comprising a support having disposed thereon, a single heat-sensitive imaging layer comprising:

a) a thermally sensitive compound comprising a heat-activatable bisulfite adduct, and b) a photothermal conversion material wherein said thermally sensitive compound is represented by the following Structure I:

(I)

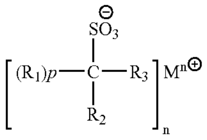

wherein $R_1$ is a polymeric backbone, $R_2$ is an aliphatic or aromatic group, M is a hydrogen or a cation of valency n, n is 1, 2, 3 or 4, p is 1, and $R_3$ is hydroxy or thio.

* * * * *